US007518459B2

(12) United States Patent
Cheng et al.

(10) Patent No.: US 7,518,459 B2
(45) Date of Patent: Apr. 14, 2009

(54) HARMONIC-REJECTION MODULATION DEVICE

(75) Inventors: Nean-Chu Cheng, Taipei (TW); Ying-Che Tseng, Taipei (TW); Sen-You Liu, Taipei (TW); Did-Min Shih, Taipei (TW)

(73) Assignee: Via Technologies Inc., Taipei (TW)

( * ) Notice: Subject to any disclaimer, the term of this patent is extended or adjusted under 35 U.S.C. 154(b) by 158 days.

(21) Appl. No.: 11/611,256

(22) Filed: Dec. 15, 2006

(65) Prior Publication Data
US 2007/0242775 A1 Oct. 18, 2007

(30) Foreign Application Priority Data
Apr. 17, 2006 (TW) .............................. 95113621 A

(51) Int. Cl.
H04L 27/20 (2006.01)
(52) U.S. Cl. .................... 332/103; 331/45; 331/74; 375/298; 375/296; 455/114.2
(58) Field of Classification Search ............ 331/45, 331/46, 74; 332/103, 104, 105; 375/298, 375/296, 295; 455/114.2, 119, 91, 147, 323, 455/76, 78; 377/47
See application file for complete search history.

(56) References Cited
U.S. PATENT DOCUMENTS
3,643,023 A 2/1972 Ragsdale et al.

5,425,074 A * 6/1995 Wong ........................... 377/47
5,708,399 A * 1/1998 Fujii et al. ................... 332/103
6,766,158 B1 * 7/2004 Molnar et al. ................ 455/323
2002/0074560 A1 6/2002 Moribe et al.
2002/0094053 A1 7/2002 Blazo
2005/0159129 A1 * 7/2005 Iida ............................ 455/326

FOREIGN PATENT DOCUMENTS
JP 01109283 A2 4/1989
WO WO 2005036751 A1 * 4/2005

OTHER PUBLICATIONS
English Abstract of JP01109283A2.

* cited by examiner

Primary Examiner—Robert Pascal
Assistant Examiner—Ryan J. Johnson
(74) Attorney, Agent, or Firm—Thomas, Kayden, Horstemeyer & Risley

(57) ABSTRACT

A harmonic-rejection modulation device is provided, which includes a phase splitter, a low pass filter, and a modulator. Based on a square wave, the phase splitter generates a plurality of unfiltered local oscillating signals having phase angles of 0°, 30°, 90°, 120°, 180°, 210°, 270° and 300°, respectively. The low pass filter filters the high frequency components of the unfiltered local oscillating signals to generate a plurality of local oscillating signals having phase angles of 0°, 30°, 90°, 120°, 180°, 210°, 270° and 300°, respectively. The modulator modulates a baseband signal with the local oscillating signals, wherein the third harmonics of the local oscillating signals are eliminated by the modulation process of the modulator. The invention also provides a method of modulating a baseband signal.

9 Claims, 4 Drawing Sheets

HARMONIC-REJECTION MODULATION DEVICE

BACKGROUND OF THE INVENTION

1. Field of the Invention

The invention relates to signal modulation, and in particular to harmonic-rejection modulation devices which reduce the harmonics of local oscillating signals to improve the modulation quality.

2. Description of the Related Art

In wireless communication systems, up-conversion architecture of a transmitter includes a modulator. Based on local oscillating signals, the modulator converts a baseband signal to an intermediate frequency signal. Sideband suppression, carrier suppression, and undesired harmonic suppression are criteria for judging the modulation quality. Sideband suppression relates to sideband leakage caused by phase or amplitude errors of modulating signals. Carrier suppression relates to carrier leakage caused by dc offset of modulating signals. Undesired harmonic suppression relates to undesired harmonics generated in the modulation process.

A LC filter circuit coupled to the modulator can filter undesired harmonics, but the filter circuit occupies a large circuit area and increases production costs. Another solution is reduction of specific harmonics by mathematical operation in modulation process. FIG. 1 shows a conventional modulation device 100 including a first poly-phase filter 102, a second poly-phase filter 104, two amplifiers 106 and 108, a modulator 110, and a filter circuit 130. An input signal 112 of the modulation device 100 is a sine wave. Based on the input signal 112, the first poly-phase filter 102 generates four signals (114) having phase angles of 45°, 135°, 225° and 315°, respectively. Based on signals 114, the second poly-phase filter 104 generates four signals 116 and four signals 118. Signals 116 have phase angles of 30°, 90°, 210°, and 270°, respectively. Signals 118 have phase angles of 0°, 120°, 180°, and 300°. Based on signals 116, the amplifier 106 generates signals 120. Based on signals 118, the amplifier 108 generates signals 122. Signals 120 and 122 are local oscillating signals for the modulator 110. Based on the local oscillating signals 120 and 122, the modulator 110 modulates the in-phase signal (I) and the quadrature phase signal (Q) of a baseband signal. The third harmonics of the local oscillating signals 120 and 122 are eliminated by mathematical operations of the modulator 110. The filter circuit 130 filters high-order harmonics of the output signals (124 and 126) of the modulator 110.

Drawbacks occur, however, when utilizing the modulation device 100. The input signal 112 of the modulation device 100 is limited to a sine wave. The modulation device 100 is incapable of dividing the frequency of the input signal 112 and an additional circuit for dividing frequency of signals is required. High current levels are required to control the amplitude of the local oscillating signals. The filer circuit 130, which filters the high-order harmonics of the signals 124 and 126, occupies a large area, increasing production costs and energy consumption.

BRIEF SUMMARY OF THE INVENTION

The invention provides harmonic-rejection modulation devices which reduce harmonics of local oscillating signals and improve the modulation quality. The harmonic-rejection modulation device includes a phase splitter, a low pass filter, and a modulator. A square wave is provided to the harmonic-rejection modulation device as an input signal. Based on the input signal, the phase splitter generates a plurality of unfiltered local oscillating signals having phase angles of 0°, 30°, 90°, 120°, 180°, 210°, 270°, and 300°, respectively. The low-pass filter filters the high frequency components of the unfiltered local oscillating signals and generates a plurality of local oscillating signals with phase angles of 0°, 30°, 90°, 120°, 180°, 210°, 270°, and 300°, respectively. Based on the local oscillating signals, the modulator modulates a baseband signal. At the same time, the effect of the third harmonics of the local oscillating signals is eliminated by the modulator.

The invention further discloses a method of modulating a baseband signal. The method includes generating a plurality of unfiltered local oscillating signals having phase angles of 0°, 30°, 90°, 120°, 180°, 210°, 270°, and 300°, respectively. High frequency components are filtered from the unfiltered local oscillating signals to generate a plurality of local oscillating signals having phase angles of 0°, 30°, 90°, 120°, 180°, 210°, 270°, and 300°. Finally, the baseband signal is modulated by the local oscillating signals, wherein the third harmonics of the local oscillating signals are eliminated in the modulation.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
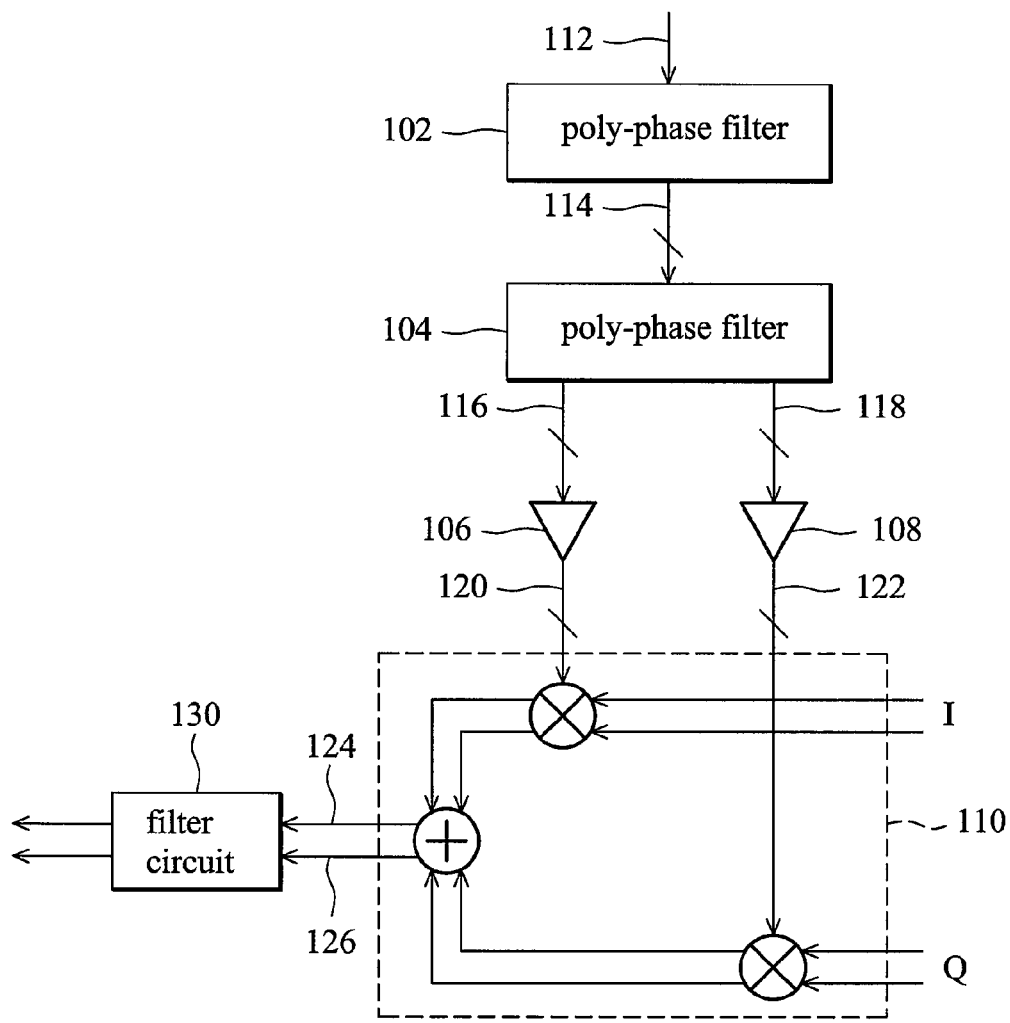
FIG. 1 shows a conventional modulation device.
Figure 2:
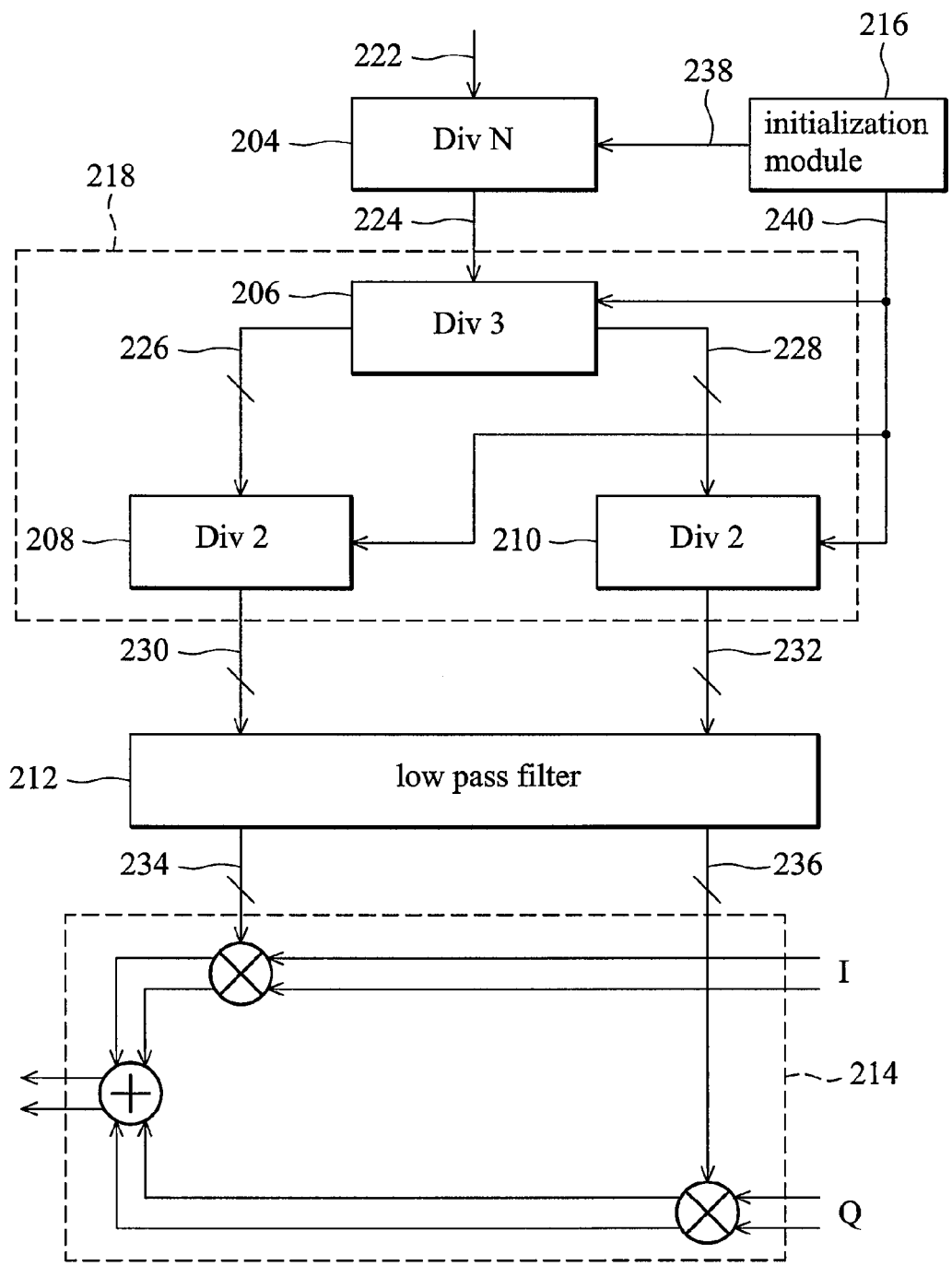
FIG. 2 shows an embodiment of the invention.

FIG. 2 shows a harmonic-rejection modulation device 200 of the invention, which includes a frequency divider 204 having a frequency divider ratio, N, an initialization module 216, a phase splitter 218, a low pass filter 212, and a modulator 214. N is a positive real number. The frequency divider 204 converts signal 222 to a square wave 224 having duty cycle of 50%. The square wave 224 is the input signal of the phase splitter 218. The phase splitter 218 includes a first frequency divider 206, a second frequency divider 208, and a third frequency divider 210. The frequency divider ratio of the first frequency divider 206 is 3. The frequency divider ratios of the second and the third frequency dividers 208 and 210 are 2. In the harmonic-rejection modulation device 200, the frequency dividers 204, 206, 208 and 210 are implemented as D-flip-flops. The first frequency divider 206 generates four frequency-divided signals (conveyed by signal lines 226 and 228). The two frequency-divided signals in signal lines 226 have phase angles of 120° and 300°, respectively. The two frequency-divided signals in signal lines 228 have phase angles of 0° and 180°, respectively. Based on the frequency-divided signals (conveyed by signal lines 226) having phase angles of 120° and 300°, the second frequency divider 208 generates four unfiltered local oscillating signals (conveyed by signal lines 230) having phase angles of 30°, 120°, 210° and 300°, respectively. Based on the frequency-divided signals (conveyed by signal lines 228) having phase angles of 0° and 180°, the third frequency divider 210 generates four unfiltered local oscillating signals (conveyed by signal lines 232) having phase angle of 0°, 90°, 180° and 270°, respectively. The low pass filter 212 filters the high frequency components of the unfiltered local oscillating signals (having phase angles of 30°, 120°, 210°, 300°, 0°, 90°, 180°, and 270°, respectively) conveyed by signal lines 230 and 232 to generates eight local oscillating signals (conveyed by signal lines 234 and 236) for the modulator 214. The signal lines 234 convey the local oscillating signals having phase angles of 30°, 90°, 210°, and 270°, respectively. The signal lines 236 convey the local oscillating signals having phase angles of 0°, 120°, 180°, and 300°, respectively. Based on the local oscillating signals conveyed by the signal lines 234 and 236, the modulator 214 modulates the in-phase signal (I) and the quadrature phase (Q) of a baseband signal, wherein the third harmonics of the local oscillating signals (in signal lines 234 and 236) are eliminated in the modulation calculation of the modulator 214.

Before the modulation process of the harmonic-rejection modulation device 200, the initialization module 216 outputs a control signal 238 for the frequency divider 204 to hold the input signal 224 of the phase splitter 218, and then outputs an initialization signal 240 for the first, second, and third frequency dividers 206, 208 and 210 to configure the initial value thereof. If the first, second, and third frequency dividers 206, 208 and 210 are synchronized, the initialization module 216 outputs the control signal 238 again to trigger the frequency divider 204 to release the input signal 224 for the phase splitter 218.

The harmonic-rejection modulation device 200 improves modulation quality while precisely regulating amplitude of the square wave 224. The local oscillating signals conveyed by signal lines 234 and 236 have exact phase angle. The low pass filter 212 filters the high order harmonics of the unfiltered local oscillating signals (in 230 and 232) which are square waves. The third harmonics of the local oscillating signals (in 234 and 236) are eliminated in the modulation calculation of the modulator 214, such that no additional filter (as filter circuit 130) is required. Compared with the conventional modulation device 100, the harmonic-rejection modulation device 200 reduces production costs and power consumption while improving sideband suppression, carrier suppression, and undesired harmonic suppression.

Figure 3:
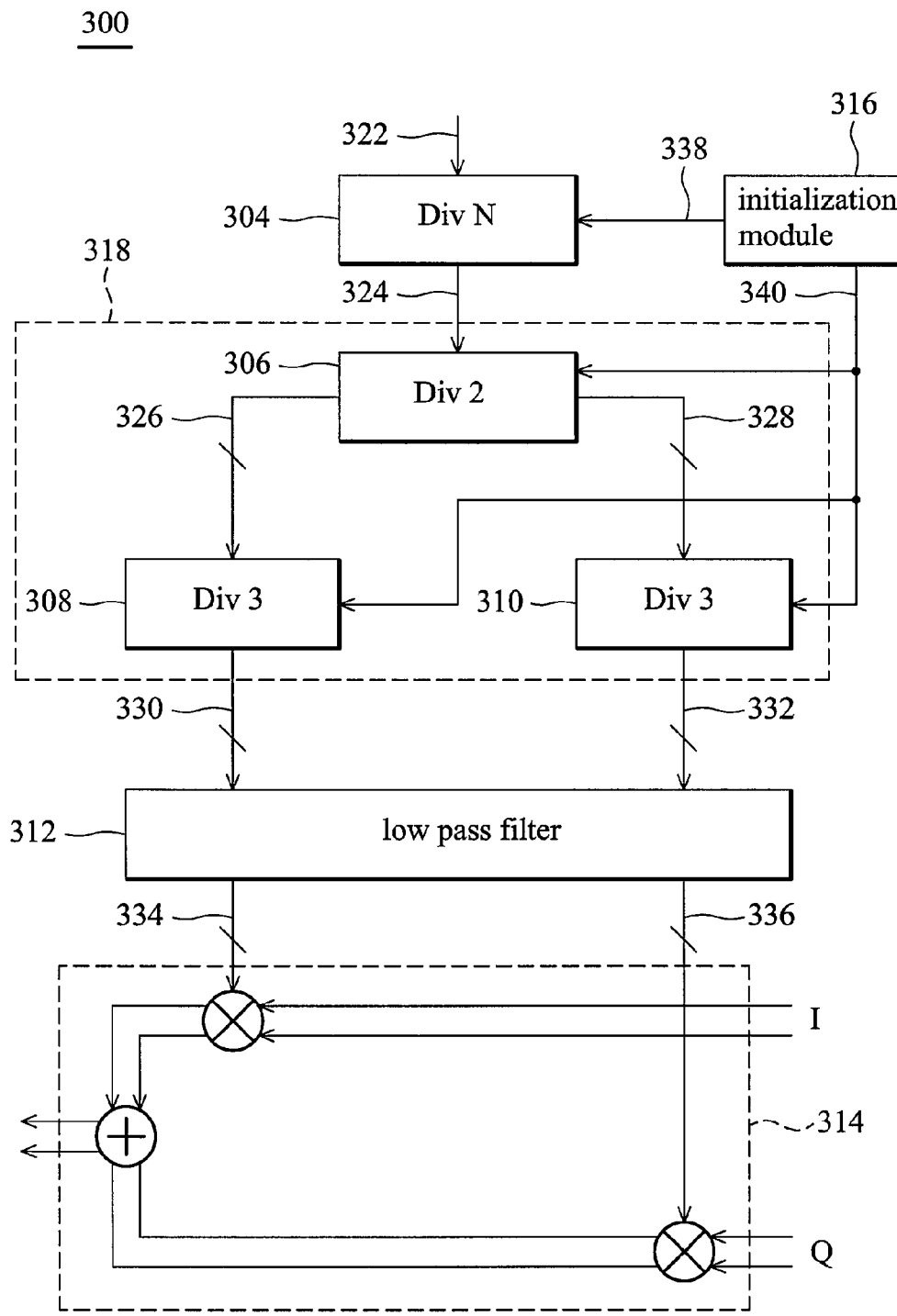
FIG. 3 shows another embodiment of the invention.

FIG. 3 shows another embodiment of the invention, in which harmonic-rejection modulation device 300 includes a frequency divider 304 having a frequency divider ratio of N, an initialization module 316, a phase splitter 318, a low pass filter 312, and a modulator 314. The frequency divider 304 converts the signal 322 to a square wave 324 having a duty cycle of 50%. The square wave 324 is the input signal of the phase splitter 318. The difference between the harmonic-rejection modulation devices 200 and 300 is the architecture of the phase splitters 218 and 318. The phase splitter 318 includes a first frequency divider 306, a second frequency divider 308, and a third frequency divider 310. The frequency dividers 306, 308 and 310 are implemented as D-Flip-Flops. The frequency divided ratio of the first frequency divider 306 is 2. The frequency divider ratios of the second and the third frequency dividers 308 and 310 are 3. Based on the square wave 324, the first frequency divider 306 generates four frequency-divided signals having phase angles of 0°, 90°, 180°, and 270°, respectively. Signal lines 326 convey the frequency-divided signals having phase angles of 90° and 270°. Signal lines 328 convey the frequency-divided signals having phase angles of 0° and 180°. Based on the frequency-divided signals (in the signal lines 326) having phase angles of 90° and 270°, the second frequency divider 308 generates four unfiltered local oscillating signals (conveyed by signal lines 330) having phase angles of 30°, 90°, 210°, and 270°, respectively. Based on the frequency-divided signals (in the signal lines 328) having phase angles of 0° and 180°, the third frequency divider 310 generates four unfiltered local oscillating signals (conveyed by signal lines 332) having phase angles of 0°, 120°, 180°, and 300°, respectively. The low pass filter 312 filters the high frequency components of the unfiltered local oscillating signals (in the signal lines 330 and 332) having phase angles of 30°, 90°, 210°, 270°, 0°, 120°, 180°, and 300° to generate local oscillating signals (conveyed by signal lines 334 and 336). The signal lines 334 convey the local oscillating signals having phase angles of 30°, 90°, 210°, and 270°. The signal lines 336 convey the local oscillating signals having phase angles of 0°, 120°, 180°, and 300°. Based on the local oscillating signals conveyed by the signal lines 334 and 336, the modulator 314 modulates the in-phase signal (I) and the quadrature phase (Q) of a baseband signal, wherein the third harmonics of the local oscillating signals (conveyed by the signal lines 334 and 336) are eliminated in the modulation calculation of the modulator 314. The modulator 314 is similar to the modulator 214 shown in FIG. 2.

Before the modulation process of the harmonic-rejection modulation device 300, the initialization module 316 outputs a control signal 338 for the frequency divider 304 to hold the input signal 324 of the phase splitter 318, and then outputs an initialization signal 340 to configure the initial value of the first, second, and third frequency dividers 306, 308 and 310. If the first, second, and third frequency dividers 306, 308, and 310 are synchronized, the initialization module 316 outputs the control signal 338 to again trigger the frequency divider 304 to release the input signal 324 for the phase splitter 318.

Figure 4:
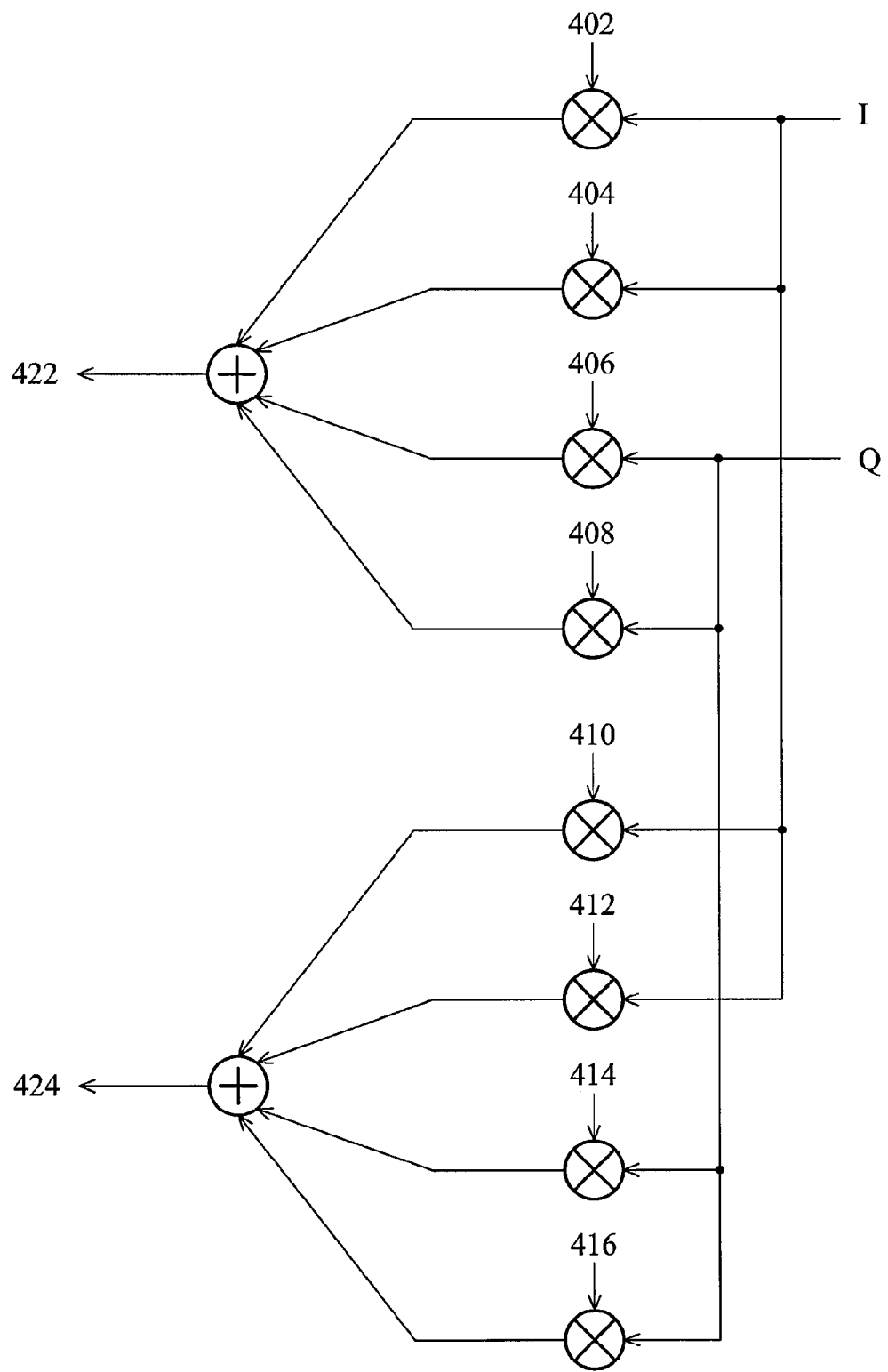
FIG. 4 illustrates the modulation calculation of the modulator of the invention.

FIG. 4 illustrates modulation calculation of the modulator 214. Based on the local oscillating signals conveyed by signal lines 234 and 236, the modulator modulates the in-phase signal (I) and the quadrature phase (Q) of a baseband signal, wherein the third harmonics of the local oscillating signals (in signal lines 234 and 236) are eliminated by modulation calculation of the modulator 214. As shown in FIG. 4, the signals 402, 404, 410 and 412 are the local oscillating signals (in the signal lines 234) having phase angles of 210°, 270°, 30°, and 90°, respectively. The signals 406, 408, 414 and 416 are the local oscillating signals (in the signal lines 236) having phase angles of 300°, 0°, 120°, and 180°, respectively. As an example, the in-phase signal (I) of a baseband signal is $\cos(w_{bb}t)$, and the quadrature phase signal (Q) of the baseband signal is $\sin(w_{bb}t)$. Because the high-order harmonics are reduced by the low pass filter 212, the local oscillating signals 402, 404, 406, 408, 410, 412, 414 and 416 can be simplified as $\cos(w_{lo}t-150) + \cos(3w_{lo}t-450)/3$, $\cos(w_{lo}t-90) + \cos(3w_{lo}t-270)/3$, $\cos(w_{lo}t-60)+\cos(3w_{lo}t-180)/3$, $\cos(w_{lo}t) + \cos(3w_{lo}t)/3$, $\cos(w_{lo}t+30) + \cos(3w_{lo}t+90)/3$, $\cos(w_{lo}t+90) + \cos(3w_{lo}t+270)/3$, $\cos(w_{lo}t+120) + \cos(3w_{lo}t+360)/3$ and $\cos(w_{lo}t-180) + \cos(3w_{lo}t-540)/3$, respectively, which can be further simplified as $\sin(w_{lo}t-60) + \sin(3w_{lo}t)/3$, $\sin(w_{lo}t) -\sin(3w_{lo}t)/3$, $\cos(w_{lo}t-60) -\cos(3w_{lo}t)/3$, $\cos(w_{lo}t) +\cos(3w_{lo}t)/3$, $\cos(w_{lo}t+30) -\sin(3w_{lo}t)/3$, $\sin(w_{lo}t) +\sin(3w_{lo}t)/3$, $-\sin(w_{lo}t+30) +\cos(3w_{lo}t)/3$ and $-\cos(w_{lo}t) -\cos(3w_{lo}t)/3$, respectively. Only the first and the third order harmonics of the local oscillating signals need be considered. As shown in the upper part of FIG. 4, the in-phase signal (I) and the quadrature phase signal (Q) of the baseband signal are modulated by the local oscillating signals 402, 404, 406 and 408 to generate a first modulation signal 422, $\cos(w_{bb}t) [\sin(w_{lo}t-60) +\sin(w_{lo}t)]+\sin(w_{bb}t) [\cos(w_{lo}t) + \cos(w_{lo}t-60)]$. As shown in the lower part of FIG. 4, the in-phase signal (I) and the quadrature phase signal (Q) of the baseband signal are modulated by the local oscillating signals 410, 412, 414 and 416 to generate a second modulation signal 424, $\cos(w_{bb}t)$ $[\cos(w_{lo}t+30) -\sin(w_{lo}t)]+\sin(w_{bb}t) [-\sin(w_{lo}t+30) -\cos(w_{lo}t)]$. The third harmonics of the local oscillating signals 402 to 416 are thus eliminated from the modulation calculation of the modulator 214.

The phase splitter 218 or 318 is utilized to generate local oscillating signals having phase angles of 0°, 30°, 90°, 120°, 180°, 210°, 270° and 300°. Any device capable of generating local oscillating signals having the same phase angles may replace the phase splitter of the harmonic-rejection modulation device of the invention. The third harmonics of these specific local oscillating signals can be successfully eliminated by the modulation calculation of the modulator disclosed.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded to the broadest interpretation so as to encompass all such modifications and similar arrangements.

What is claimed is:

1. A harmonic-rejection modulation device for modulating a baseband signal, comprising:
    a phase splitter, generating a plurality of unfiltered local oscillating signals based on an input signal, wherein the unfiltered local oscillating signals have phase angles of 0°, 30°, 90°,120°, 180°, 210°, 270°, and 300°, respectively;
    a low pass filter, filtering the high frequency signals from the unfiltered local oscillating signals, and generating a plurality of local oscillating signals having phase angles of 0°, 30°, 90°, 120°, 180°, 210°, 270°, and 300°, respectively; and
    a modulator, modulating an in-phase signal of the baseband signal by the local oscillating signal having 210° phase angle to generate a first signal, modulating the in-phase signal by the local oscillating signal having 270° phase angle to generate a second signal, modulating a quadrature phase signal by the local oscillating signal having 300° phase angle to generate a third signal, modulating the quadrature phase signal by the local signal having 0° phase angle to generate a fourth signal, modulating the in-phase signal by the local signal having 30° phase angle to generate a fifth signal, modulating the in-phase signal by the local oscillating signal having 90° phase angle to generate a sixth signal, modulating the quadrature phase signal by the local oscillating signal having 120° phase signal to generate a seventh signal, modulating the quadrature phase signal by the local oscillating signal having 180° phase angle to generate an eighth signal, summing up the first, second, third and fourth signals to generate a first modulation signal, and summing up the fifth, sixth, seventh and eighth signals to generate a second modulation signal.

2. The harmonic-rejection modulation device as claimed in claim 1, wherein the phase splitter comprises a plurality of frequency dividers.

3. The harmonic-rejection modulation device as claimed in claim 1, wherein the input signal is a square wave having 50% duty cycle.

4. The harmonic-rejection modulation device as claimed in claim 1, wherein the phase splitter comprises:
    a first frequency divider, generating a plurality of frequency-divided signals based on the input signal, the frequency-divided signals having phase angles of 0°, 120°, 180° and 300°, respectively, wherein the frequency divider ratio of the first frequency divider is 3;
    a second frequency divider, generating the unfiltered local oscillating signals having phase angles of 30°, 120°, 210° and 300° based on the frequency-divided signals having phase angles of 120° and 300°, wherein the frequency divider ratio of the second frequency divider is 2; and
    a third frequency divider, generating the unfiltered local oscillating signals having phase angles of 0°, 90°, 180° and 270° based on the frequency-divided signals having phase angles of 0° and 180° , wherein the frequency divider ratio of the second frequency divider is 2.

5. The harmonic-rejection modulation device as claimed in claim 1, wherein the phase splitter comprises:
    a first frequency divider, generating a plurality of frequency-divided signals based on the input signal, the frequency-divided signals having phase angles of 0°, 90°, 180° and 270°, respectively, wherein the frequency divider ratio of the first frequency divider is 2;
    a second frequency divider, generating the unfiltered local oscillating signals having phase angles of 30°, 90°, 210° and 270° based on the frequency-divided signals having phase angles of 90° and 270°, wherein the frequency divider ratio of the second frequency divider is 3; and
    a third frequency divider, generating the unfiltered local oscillating signals having phase angles of 0°, 120°, 180° and 300° based on the frequency-divided signals having phase angles of 0° and 180°, wherein the frequency divider ratio of the second frequency divider is 3.

6. A method of modulating a baseband signal, comprising:
    generating a plurality of unfiltered local oscillating signals based on an input signal, the unfiltered local oscillating signals having phase angles of 0°, 30°, 90°, 120°, 180°, 210°, 270° and 300°, respectively;
    filtering high frequency signals from the unfiltered local oscillating signals to generate a plurality of local oscillating signals, the local oscillating signals having phase angles of 0°, 30°, 90°, 120°, 180°, 210°, 270° and 300°, respectively; and
    modulating an in-phase signal of the baseband signal by the local oscillating signal having 210° phase angle to generate a first signal;
    modulating the in-phase signal by the local oscillating signal having 270°phase angle to generate a second signal;
    modulating a quadrature phase signal by the local oscillating signal having 300° phase angle to generate a third signal;
    modulating the quadrature phase signal by the local signal having 0° phase angle to generate a fourth signal;
    modulating the in-phase signal by the local signal having 30° phase angle to generate a fifth signal;
    modulating the in-phase signal by the local oscillating signal having 90° phase angle to generate a sixth signal;
    modulating the quadrature phase signal by the local oscillating signal having 120° phase signal to generate a seventh signal;
    modulating the quadrature phase signal by the local oscillating signal having 180° phase angle to generate an eighth signal;
    summing up the first, second, third and fourth signals to generate a first modulation signal; and summing up the fifth, sixth, seventh and eighth signals to generate a second modulation signal.

7. The method as claimed in claim 6, wherein the input signal is a square wave having 50% duty cycle.

8. The method as claimed in claim 6, wherein generation of the unfiltered local oscillating signals further comprises:

generating a plurality of frequency-divided signals by dividing the frequency of the input signal by 3, the frequency-divided signals having phase angles of 0°, 120°, 180° and 300°, respectively;

generating the unfiltered local oscillating signals having phase angles of 30°, 120°, 210° and 300° by dividing the frequency of the frequency-divided signals having phase angles of 120° and 300° by 2; and generating the unfiltered local oscillating signals having phase angles of 0°, 90°, 180° and 270° by dividing the frequency of the frequency-divided signals having phase angles of 0° and 180° by 2.

9. The method as claimed in claim 6, wherein generation of the unfiltered local oscillating signals further comprises:

generating a plurality of frequency-divided signals by dividing the frequency of the input signal by 2, the frequency-divided signals having phase angles of 0°, 90°, 180° and 270°, respectively;

generating the unfiltered local oscillating signals having phase angles of 30°, 90°, 210° and 270° by dividing the frequency of the frequency-divided signals having phase angles of 90° and 270° by 3; and generating the unfiltered local oscillating signals having phase angles of 0°, 120°, 180° and 300° by dividing the frequency of the frequency-divided signals having phase angles of 0° and 180° by 3.

* * * * *